United States Patent [19]

Chen et al.

[11] Patent Number: 5,684,332
[45] Date of Patent: Nov. 4, 1997

[54] METHOD OF PACKAGING A SEMICONDUCTOR DEVICE WITH MINIMUM BONDING PAD PITCH AND PACKAGED DEVICE THEREFROM

[75] Inventors: C. M. Chen, Kaohsiung; James Chung, Tainin; K. T. Lin; Pony Maa, both of Kaohsiung; Simon Li, Tainin, all of Taiwan

[73] Assignee: Advanced Semiconductor Engineering, Inc., San Jose, Calif.

[21] Appl. No.: 579,093

[22] Filed: Dec. 20, 1995

Related U.S. Application Data

[63] Continuation of Ser. No. 250,247, May 27, 1994, abandoned.

[51] Int. Cl.⁶ .................... H01L 23/48; H01L 23/52; H01L 29/40
[52] U.S. Cl. ..................... 257/786; 257/695; 257/784
[58] Field of Search .................... 257/784, 786, 257/659, 687, 695

[56] References Cited

U.S. PATENT DOCUMENTS

| | | | |
|---|---|---|---|
| 4,403,240 | 9/1983 | Seki et al. | 257/784 |
| 4,875,138 | 10/1989 | Cusack | 257/786 |
| 5,045,919 | 9/1991 | Nagaoka | 257/786 |
| 5,359,227 | 10/1994 | Lange et al. | 257/784 |
| 5,550,087 | 8/1996 | Brossart | 437/217 |

FOREIGN PATENT DOCUMENTS

| | | | |
|---|---|---|---|
| 59-021035 | 2/1984 | Japan | 257/784 |
| 59-222949 | 12/1984 | Japan | 257/659 |
| 1183129 | 7/1989 | Japan | 257/784 |
| 3-218658 | 9/1991 | Japan | 257/687 |
| 4-199673 | 7/1992 | Japan | 257/784 |

*Primary Examiner*—Mahshid D. Saadat
*Assistant Examiner*—T. M. Arroyo
*Attorney, Agent, or Firm*—Townsend and Townsend and Crew LLP; Gary T. Aka

[57] ABSTRACT

A package for a semiconductor die having a plurality of bonding pads about its periphery is provided. The package has a plastic molding encapsulating the semiconductor die. The package also has a plurality of conductive leads with leads having inner and outer portions, the inner portions encapsulated in the molding and arranged substantially in a plane and radially about the semiconductor die with ends displaced from and forming a rectangle with four corners about the die. A bonding wire extends from each of the bonding pads to one of the inner portions of the leads. Bonding wire loop heights of approximately 8 mils are made with a specially designed tip of a capillary tool. The package also has a pair of leads with inner portions at opposite corners of the rectangle, each of the inner portions connected to a pair of bonding wires from a pair of contiguous bonding pads on the die. This double wiring arrangement prevents wire sweep during the injection molding step. Bonding pad pitches of 4 mils or less on the semiconductor die are possible.

4 Claims, 2 Drawing Sheets

5,684,332

METHOD OF PACKAGING A SEMICONDUCTOR DEVICE WITH MINIMUM BONDING PAD PITCH AND PACKAGED DEVICE THEREFROM

This is a Continuation of application Ser. No. 08/250,247, filed May 27, 1994, now abandoned.

BACKGROUND OF THE INVENTION

The present invention is related to semiconductor device packaging and, more particularly, to plastic packaging of integrated circuits having a high lead count.

It is a constant goal in semiconductor processing technology to shrink the features of a semiconductor device to smaller and smaller dimensions. The resulting advantages include lower costs as yields rise and better performance as electrical path lengths shrink. Much effort has been directed toward better materials and more accurate equipment with the resulting improvements so that critical dimensions in many advanced semiconductor processes are now below 0.5 microns.

However, one constraint to the shrinkage in integrated circuit dimensions has been packaging technology. The most common type of semiconductor packaging is plastic packaging in which conductive leads are placed around a semiconductor die and wires are bonded between the inner ends of the leads to bonding pads on the integrated circuit. The die, bonding wires and the inner portions of the leads are encased in "plastic", actually some form of epoxy resin.

However, packaging technology has long limited the spacing of the bonding pads on the semiconductor die. This constraint on the bonding pads, in turn, limits the shrinkage of an integrated circuit, especially one with a large number of bonding pads. Presently integrated circuits with bonding pads numbering more than two hundred are common. Since the bonding pads are typically placed around the edge of the semiconductor die, a limitation in the bonding pad spacing limits the perimeter of the semiconductor die, and hence, the area of the die.

The present invention permits the separation of the bonding pads to be decreased to remove one constraint in the semiconductor processing. This permits a savings in the costs of producing a semiconductor device.

SUMMARY OF THE INVENTION

The present invention provides for a package for a semiconductor die having a plurality of bonding pads about its periphery. The package comprising has a plastic molding encapsulating the semiconductor die. The package also has a plurality of conductive leads with leads having inner and outer portions, the inner portions encapsulated in the molding and arranged substantially in a plane and radially about the semiconductor die with ends displaced from and forming a rectangle with four corners about the die. A bonding wire extends from each of the bonding pads to one of the inner portions of the leads. A bonding wire loop height of approximately 8 mils is used. The package also has a pair of leads with inner portions at opposite corners of the rectangle, each of the inner portions connected to a pair of bonding wires from a pair of contiguous bonding pads on the die. This double wiring arrangement prevents wire sweep during the injection molding step. Bonding pad pitches of 4 mils or less on the semiconductor die are possible.

The present invention also provides for a method of packaging a die with the resulting package described above.

Included in the packaging method is the use of a capillary tip having a taper angle of $\theta=5°$. This allows the wire bonding of the die with bonding pad pitches of 4 mils or less without undue breakage of the capillary tool.

DETAILED DESCRIPTION OF THE PREFERRED EMBODIMENTS

Figure 1:
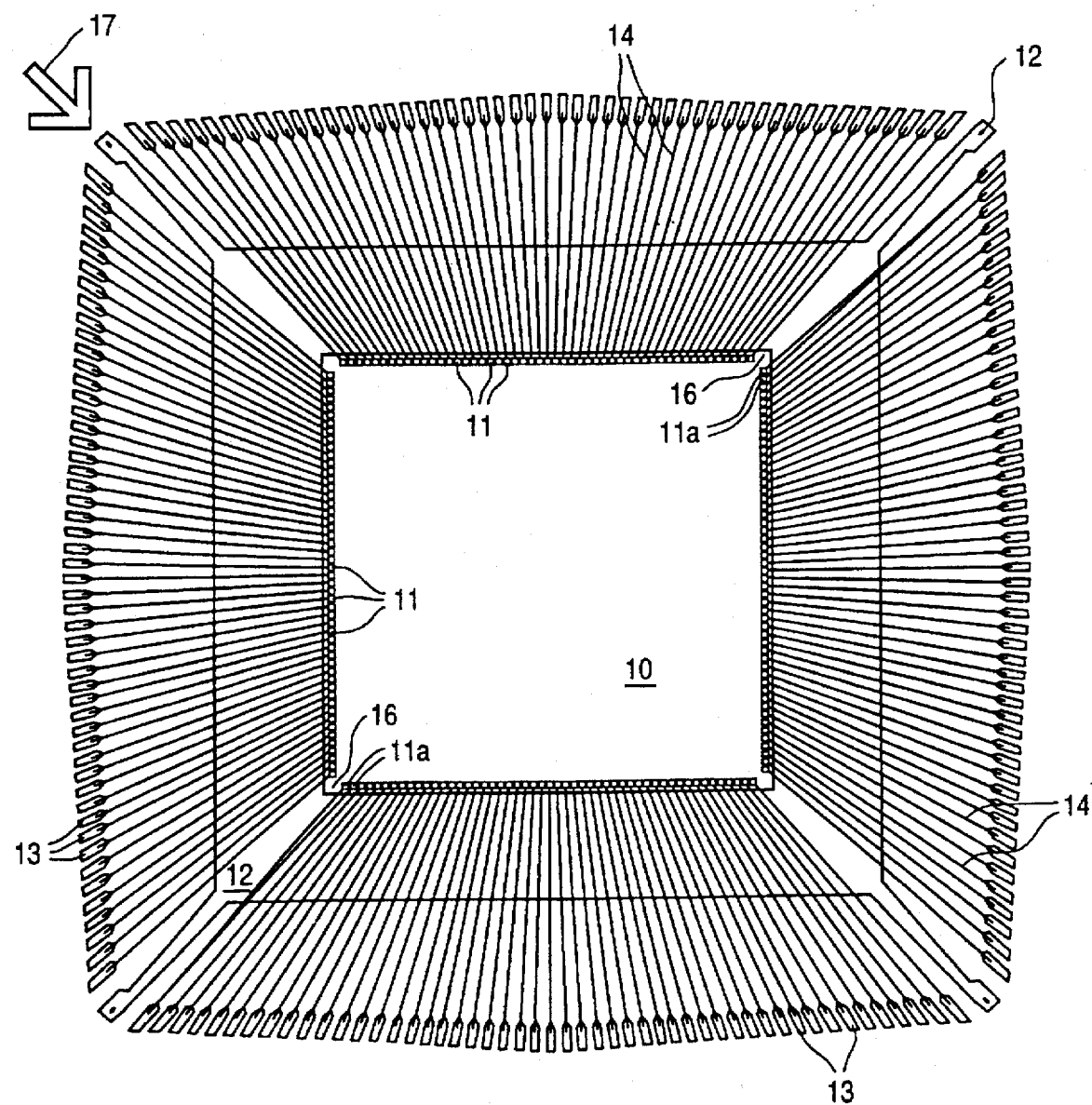
FIG. 1 is a top view of the inner portion of a plastic package of a high lead-count integrated circuit according to the present invention.

FIG. 1 illustrates the interior portion of high lead-count plastic package in accordance with the present invention. An integrated circuit die 10 has a multitude of bonding pads 11 located on the periphery of the die 10. The integrated circuit die 10 is fixed to a metal die island 12 by epoxy. Around the periphery of the die 10, in a generally rectangular configuration, are the ends of conducting leads 13. Each of the conducting leads are connected to a bonding pad 11 by a bonding wire 14. It should be noted that the reference numerals 11, 13, and 14 are used for a few representative bonding pads, conducting leads and bonding wires respectively. The interior portion of the package, illustrated in FIG. 1, is placed in a mold into which plastic, actually an epoxy resin, is injected to completely fill the mold. The plastic is injected through a gate into the mold at one of the corners of the die. The direction of the injected plastic is indicated by an arrow 17 in FIG. 1. The external portions of the conducting leads protrude from the plastic molding to form conducting paths from the exterior of the package into the bonding pads in the integrated circuit 10. As described, all these manufacturing steps and elements are well-known to semiconductor process engineers.

Presently, the minimum bonding pad pitch, the distance between bonding pads for high lead-count integrated circuits is approximately 4.5 mils. The present invention breaks this 4.5 mils bonding pad pitch limitation by various improvements in packaging technology.

Figure 2:
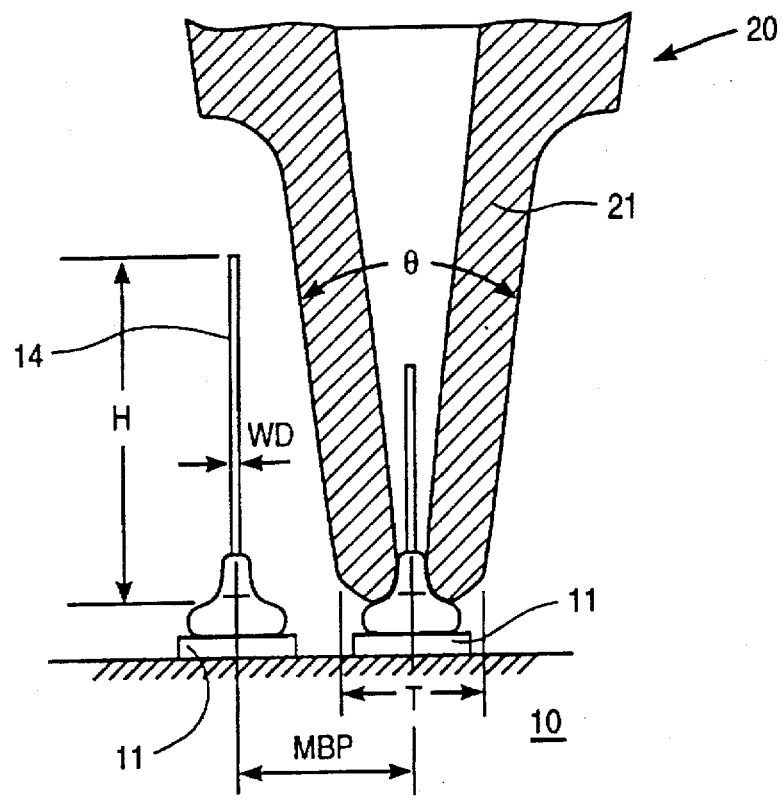
FIG. 2 is a cross-sectional view of a capillary tip and a portion of an integrated circuit according to the present invention.

The first improvement is in the bottleneck capillary tool, which is used to place the bonding wire 14 between the bonding pads 11 and the leads 13. The tool 20 has been modified to permit a very fine spacing between the bonding pads 11 of the integrated circuit die 10. As shown in FIG. 2, the capillary tool 20 has a modified tip 21 having a taper angle $\theta$ of 5°. That is, with $\theta=0°$ representing no taper, the described capillary tip has an optimum taper, which is slight enough to operate with a fine bonding pad pitch, yet sturdy to permit the tool 20 to operate without undue breakage. The diameter of the tip, T, is approximately 5.5 mils to handle bonding wire having a diameter of 1.3 mils. This permits a wire ball-size diameter of 2.8–3.0 mils for the wire 14 for effective thermal compression bonding of the wire 14 to the bonding pads 11 and the ends of the leads 13.

Another improvement is that the height of the loop for the bonding wire 14 has been set at an optimum height of 8 mils. The loop height is the distance from the bonding pad 11 to the top of the wire 14 before it bends downward to one of the leads 14. Too low a loop height renders the bonding wire 14 subject to breakage and undesirable contact with the die 10. Too high a loop height interferes with the wire bonding process at fine bonding pad pitches.

The minimum bonding pad pitch, MBP, can be calculated by the equation:

$$MBP = T/2 + H * \tan(\theta/2) + WD/2 + (\text{MACHINE \& OPERATION ERROR}).$$

As stated, T is the capillary tip diameter, H is the bonding wire loop height, θ is the capillary tip taper, WD is the diameter of the bonding wire. With the machine and operation error at 0.2 mils, standard with present state-of-the-art wire bonding machines, a minimum bonding pitch of less than 4 mils is possible.

Figure 3:
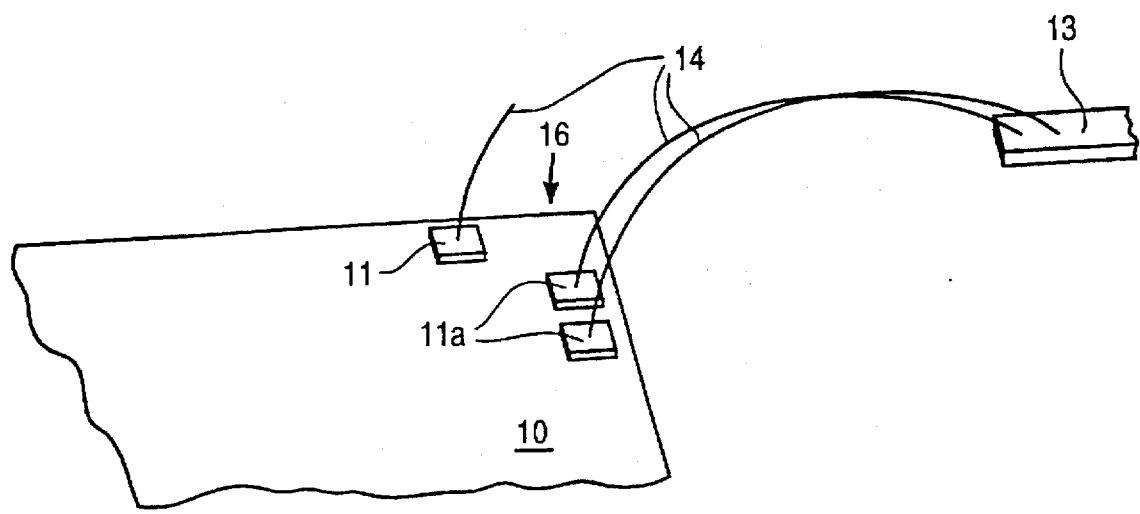
FIG. 3 is a perspective view of one corner of the integrated circuit of FIG. 1.

Furthermore, the present invention provides for the double-bonding of pads 11A at corners 16 of the integrated circuit die 10, which are diagonally opposed to the corner from which the plastic is injected into the mold. This is shown in detail in FIG. 3. Two pads 11A are bonded to the same lead 13. Alternatively, the two bonding pads 11A may be merged into one large bonding pad having two wires bonded and attached to a single lead 14. It should be evident that the two bonding pads 11A are connected to the same electrical circuit of the integrated circuit.

The double bonding of the pads 11A solves the problem of wire sweep for die with fine bonding pad pitch. Returning to FIG. 1, arrow 17 illustrates the corner from which plastic is injected into the mold (not shown). Diagonally opposed corners 16 of the integrated circuit die 10 receive the force of the injected plastic perpendicular to the direction of the bonding wires 14. At these corner locations, the wires 14 often are forced by the sweep of the plastic such that the wires 14 touch a neighboring wire. This renders the integrated circuit package dysfunctional, since the wires 14 should remain electrically isolated from each other. It should be noted that the bonding wires 14 in other locations are not likely subjects of wire sweep since the direction of plastic flow is not as severe and the neighboring wires act as a partial shield.

With the double wire bond of the present invention, the wire closest to the brunt of the injected plastic acts as a shield for its double. Contact between the two wires 14 at the corners 16 is harmless since the wires are part of the same electrical path. It should be noted that while double wire bonding has been found to work effectively, the present invention also contemplates higher numbers of multiple wire bonding under more severe conditions of wire sweep.

Thus the present invention makes it possible to reduce the bonding pad pitch on a die from 4.5 to 4.0 mils with no yield loss. For high lead-count integrated circuits, this permits a 25–30% reduction in the size of the integrated circuit die with a concomitant increase in manufacturing yields. This solution of a long-standing problem in the semiconductor art generates a significant cost savings in semiconductor manufacturing technology.

While the above is a complete description of the preferred embodiments of the present invention, various alternatives, modifications and equivalents may be used. It should be evident that the present invention is equally applicable by making appropriate modifications to the embodiment described above. Therefore, the above description should not be taken as limiting the scope of invention which is defined by the metes and bounds of the appended claims.

What is claimed is:

1. A package and semiconductor die having a plurality of edges and a plurality of bonding pads along said edges, said package and semiconductor die comprising a plastic molding encapsulating said semiconductor die;

a plurality of conductive leads, said leads having inner and outer portions, said inner portions encapsulated in said molding, said inner portions arranged substantially in a plane and radially about said semiconductor die, said inner portions having ends displaced from and forming a rectangle with four corners about said die;

a bonding wire extending from each of said bonding pads to an inner portion of one of said leads, said bonding pads spaced evenly about said semiconductor die edges and having a pitch equal to, or less than, 4 mils, a majority of said leads having a single bonding wire connected to an inner portion thereof to a bonding pad; and only one pair of leads having inner portions at opposite corners of said rectangle, each of said inner portions connected to at least a pair of bonding wires from at least a pair of contiguous bonding pads.

2. A packaged device comprising a semiconductor die having a plurality of bonding pads, said bonding pads having a pitch equal to, or less than, 4 mils;

a plastic molding encapsulating said semiconductor die;

a plurality of conductive leads, said leads having inner and outer portions, said inner portions encapsulated in said molding, said inner portions substantially arranged in a plane and radially about said semiconductor die, said inner portions having ends displaced from and forming a rectangle with four corners about said die; and a bonding wire extending from each of said bonding pads to an inner portion of one of said leads.

3. The packaged and semiconductor die of claim 2 wherein said bonding wires have a diameter approximately 1.3 mils.

4. The packaged and semiconductor die of claim 2 wherein said bonding wires have a loop height of approximately 8 mils.

* * * * *